US012261013B2

(12) United States Patent
Kaneko et al.

(10) Patent No.: US 12,261,013 B2
(45) Date of Patent: Mar. 25, 2025

(54) CHARGED PARTICLE BEAM SYSTEM AND CONTROL METHOD THEREFOR

(71) Applicant: JEOL Ltd., Tokyo (JP)

(72) Inventors: Takeshi Kaneko, Tokyo (JP); Isamu Ishikawa, Tokyo (JP); Eiji Okunishi, Tokyo (JP)

(73) Assignee: JEOL Ltd., Tokyo (JP)

( * ) Notice: Subject to any disclaimer, the term of this patent is extended or adjusted under 35 U.S.C. 154(b) by 427 days.

(21) Appl. No.: 17/964,516

(22) Filed: Oct. 12, 2022

(65) Prior Publication Data

US 2023/0115486 A1 Apr. 13, 2023

(30) Foreign Application Priority Data

Oct. 13, 2021 (JP) .................. 2021-168130

(51) Int. Cl.
*H01J 37/04* (2006.01)
*H01J 37/20* (2006.01)
*H01J 37/26* (2006.01)
(52) U.S. Cl.
CPC ............ *H01J 37/045* (2013.01); *H01J 37/20* (2013.01); *H01J 37/26* (2013.01); *H01J 2237/151* (2013.01); *H01J 2237/20207* (2013.01)
(58) Field of Classification Search
USPC ................................................... 250/396 R
See application file for complete search history.

(56) References Cited

U.S. PATENT DOCUMENTS

| 11,127,562 B1* | 9/2021 | Kieft ................ H01J 37/265 |
| 2005/0029452 A1 | 2/2005 | Furukawa et al. |
| 2017/0330724 A1 | 11/2017 | Okumura et al. |

FOREIGN PATENT DOCUMENTS

| JP | 200519218 A | 1/2005 |
| JP | 2016103387 A | 6/2016 |

OTHER PUBLICATIONS

Office Action issued in JP2021168130 on Aug. 29, 2023.

* cited by examiner

*Primary Examiner* — Kiet T Nguyen
(74) *Attorney, Agent, or Firm* — The Webb Law Firm

(57) ABSTRACT

Provided is a charged particle beam system capable of preventing the data acquisition time from increasing. A control method for the system is also provided. The charged particle beam system includes: a beam blanker for blanking a charged particle beam; a sample stage on which a sample is tiltably held and thus can assume a tilt angle; a blanking controller for controlling the blanking of the charged particle beam and causing a pulsed beam having a duty ratio to be directed at the sample; and a tilt controller for controlling the tilt angle of the sample. The blanking controller sets the duty ratio of the pulsed beam based on the tilt angle of the sample.

4 Claims, 2 Drawing Sheets

CHARGED PARTICLE BEAM SYSTEM AND CONTROL METHOD THEREFOR

CROSS REFERENCE TO RELATED APPLICATION

This application claims priority to Japanese Patent Application No. 2021-168130, filed Oct. 13, 2021, the disclosure of which is hereby incorporated by reference in its entirety.

BACKGROUND OF THE INVENTION

1. Field of the Invention

The present invention relates to a charged particle beam system and a method for controlling the same.

2. Description of Related Art

Tomography is known which permits structural observation or analysis of a three-dimensional structure by applying computerized tomography (CT) to a transmission electron microscope (TEM) or a scanning transmission electron microscope (STEM) (see, for example, JP-A-2005-19218). In computerized tomography, a sample is tilted at various angles and a TEM image is generated at each tilt angle. As a result, a series of tilted TEM images results. If the sample is tilted, the apparent thickness of the sample varies. Therefore, the conventional procedure is to vary the exposure time (time taken to acquire data about a tilted image) according to the tilt angle of the sample such that the exposure time is lengthened with increasing tilt angle.

If the dose of the electron beam is controlled using the data acquisition time for the detector as described above, an exorbitantly long time is required to obtain a series of tilted images. This in turn causes sample drift, deteriorating the quality of the resulting images. Also, the electron beam irradiation inflicts great damage on the sample.

SUMMARY OF THE INVENTION

The present invention has been made in view of the problems described so far. According to some aspects of the present invention, there are provided a charged particle beam system capable of preventing prolongation of the data acquisition time and a method of controlling the charged particle beam system.

(1) A charged particle beam system associated with the present invention includes: a beam blanker for blanking a charged particle beam; a sample stage on which a sample is tiltably held and thus can assume a tilt angle; a blanking controller for controlling blanking of the charged particle beam and causing a pulsed beam having a duty ratio to be directed at the sample; and a tilt controller for controlling the tilt angle of the sample. The blanking controller sets the duty ratio of the pulsed beam based on the tilt angle of the sample.

A control method associated with the present invention is for use in a charged particle beam system including a beam blanker for blanking a charged particle beam and a sample stage on which a sample can be tiltably held and thus can assume a tilt angle. The control method starts with irradiating the sample with a pulsed beam having a duty ratio while controlling blanking of the charged particle beam. The tilt angle of the sample is controlled. During the step of controlling the blanking, the duty ratio of the pulsed beam is set based on the tilt angle of the sample.

According to the control method of the present invention, the dose of the charged particle beam is controlled by varying the duty ratio of the pulsed beam according to the tilt angle and, therefore, prolongation of the data acquisition time can be prevented.

(2) In the charged particle beam system and control method associated with the present invention, during the step of controlling the blanking, the blanking controller may so set the duty ratio as to increase with increasing absolute value of the tilt angle.

(3) In the charged particle beam system and control method associated with the present invention, the beam blanker may be electrostatic deflecting plates.

DESCRIPTION OF THE INVENTION

Non-limiting embodiments of the present invention are hereinafter described in detail with reference to the accompanying drawings. It is to be understood that the embodiments provided below are not intended to unduly restrict the contents of the present invention delineated by the claims and that not all the configurations set forth below are the essential constituent components of the invention.

Figure 1:
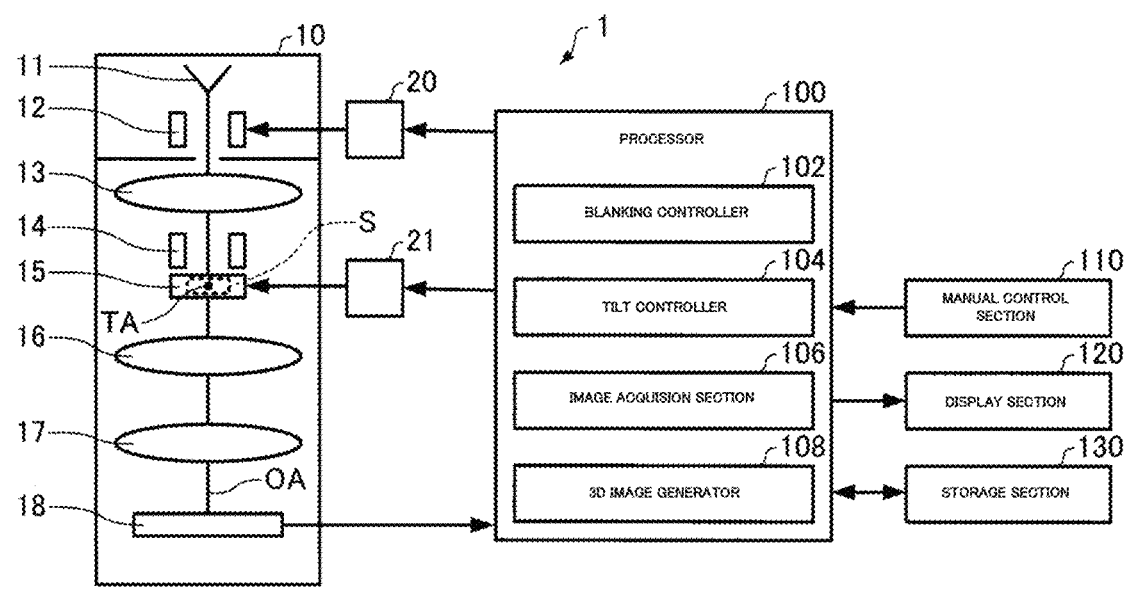
FIG. 1 is a diagram showing one example of configuration of a charged particle beam system associated with one embodiment of the present invention.

FIG. 1 shows one example of the configuration of a charged particle beam system (such as an electron microscope) associated with the present embodiment. In this example, the electron microscope assumes the form of a transmission electron microscope (TEM). Alternatively, the electron microscope may assume the form of a scanning transmission electron microscope (STEM). Some of the components of the electron microscope of the present embodiment shown in FIG. 1 may be omitted.

As shown in FIG. 1, the electron microscope, 1, includes a microscope body 10, a processor 100, a manual control section 110, a display section 120, and a data storage section 130.

The electron microscope body 10 includes an electron beam source 11, a beam blanker 12, an illumination lens system 13, a deflector assembly 14, a sample stage 15, an objective lens 16, a projector lens 17, a detector 18, a blanker controller 20, and a stage controller 21.

The electron beam source 11 emits an electron beam which is one example of a charged particle beam by accelerating electrons by means of an anode after the electrons are released from a cathode. For example, an electron gun can be used as the electron beam source 11.

The beam blanker 12 is disposed behind the electron beam source 11 and operates to blank the electron beam under control of the blanker controller 20. Electrostatic deflecting plates (electrostatic shutters) capable of blanking and unblanking (turning on and off) the electron beam at high speed are used as the beam blanker 12.

The illumination lens system 13 is made up of plural condenser lenses (not shown) and disposed behind the beam blanker 12. The illumination lens system 13 adjusts the angle of convergence of the electron beam incident on a sample S.

The deflector assembly 14 is located behind the illumination lens system 13 and has a plurality of deflection coils and a current controller (not shown) for controlling the amounts of current flowing through the deflection coils. The deflector assembly 14 deflects the incident electron beam in two dimensions by controlling the currents flowing through the deflection coils under control of the current controller.

The sample stage 15 holds the sample S thereon such that it is located behind the deflector assembly 14. The sample stage 15 moves the sample S horizontally or vertically or rotates or tilts the sample S under control of the stage controller 21. The sample stage 15 is configured to be tiltable about a tilted axis TA perpendicular to an optical axis OA. The sample stage 15 holds the sample S such that the sample S tilts about the tilted axis TA.

The objective lens 16 is disposed behind the sample S and operates to bring the electron beam transmitted through the sample S into focus. The projector lens 17 is positioned behind the objective lens 16 and operates to magnify the image focused by the objective lens 16 and to focus the magnified image onto the detector 18.

The detector 18 is disposed behind the projector lens 17 and operates to detect the TEM image focused by the projector lens 17. One example of the detector 18 is a CCD camera having a photosensitive surface formed by a two-dimensional array of charge-coupled devices (CCDs). Information about the TEM image detected by the detector 18 is output to the processor 100.

The manual control section 110 permits a user to enter control information about manipulative actions and outputs the entered information to the processor 100. The function of the manual control section 110 can be realized by a keyboard, a mouse, a touch panel display, or other hardware device.

The display section 120 operates to display the image created by the processor 100. The function of the display section 120 can be implemented by an LCD, a CRT, or the like. The display section 120 displays TEM images, reconstructed cross-sectional images, and three-dimensional images generated by the processor 100.

Computer programs and various kinds of data are stored in the storage section 130 to enable a computer to operate as various parts of the processer 100. The storage section 130 also operates as a working area for the processor 100. The function of the storage section 130 can be implemented by a hard disk, a RAM, or the like.

The processor 100 performs various operations including operations for controlling the blanker controller 20, the stage controller 21, and other components, operations for collecting TEM images, and operations for constructing three-dimensional images of the sample S. The functions of the processor 100 can be implemented either by hardware devices such as various processors (e.g., a CPU and a DSP) or by software. The processor 100 includes the blanking controller 102, a tilt controller 104, an image acquisition section 106, and a 3D image generator 108.

The blanking controller 102 controls the operation of the beam blanker 12 to blank the electron beam by generating a control signal and outputting it to the blanker controller 20. The blanking controller 102 irradiates the sample S with a pulsed beam by blanking and unblanking the electron beam at high speed.

The tilt controller 104 incrementally controls the tilt angle of the sample stage 15 (i.e., the sample S) by generating a control signal to the stage controller 21. The blanking controller 102 controls the duty ratio of the pulsed beam (i.e., the ratio of the irradiation period to the blanking/unblanking period of the electron beam) based on the tilt angle set by the tilt controller 104.

The image acquisition section 106 operates to acquire TEM (transmission electron microscopy) images by accepting image information output from the detector 18. In particular, the image acquisition section 106 acquires a TEM image at each of tilt angles of the sample stage 15 and thus obtains a series of tilted images. For example, the sample S is tilted in 121 increments of 1° from −60° to +60°, and 121 TEM images are acquired. A maximum tilt angle of the sample S (60° in the above example) and an incremental angular step (1° in the above example) are previously stored as setting information in the storage section 130.

The 3D image generator 108 performs processing to construct a three-dimensional image of the sample S based on the series of tilted images acquired by the image acquisition section 106. In particular, the 3D image generator 108 reconstructs cross-sectional images by applying computerized tomography to the series of tilted TEM images and constructs a three-dimensional image of the sample S by overlapping the reconstructed cross-sectional images.

Figure 2:
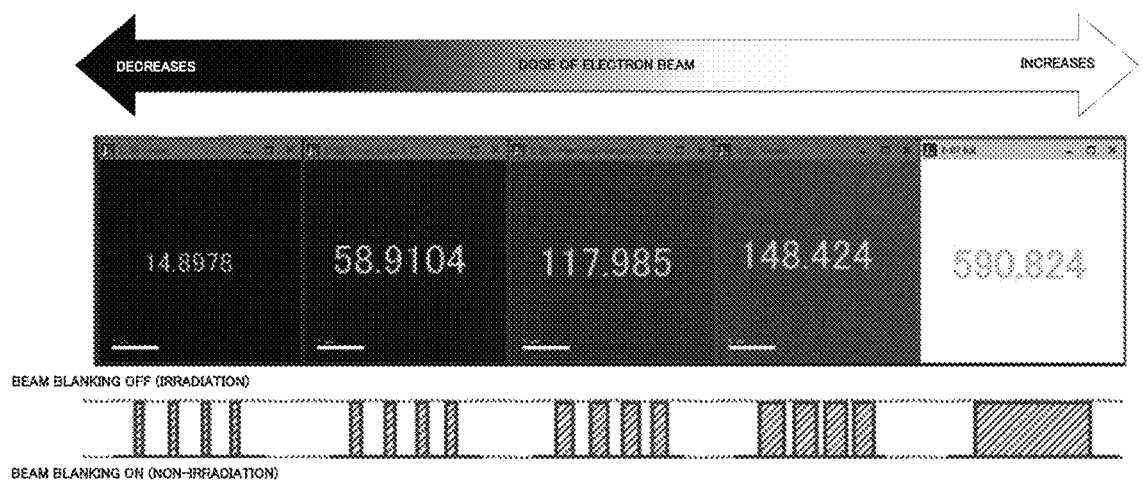
FIG. 2 illustrates the relationship between the duty ratio of a pulsed beam and the dose of an electron beam.

If the sample S is tilted in order to obtain a tilted image, the apparent thickness of the sample S, i.e., the thickness taken along the optical axis OA, varies. That is, the amount of electrons transmitted through the sample S varies according to the tilt angle of the sample S. The amount of electrons transmitted decreases with increasing absolute value of the tilt angle. Accordingly, in the technique of the present embodiment, blanking of the electron beam is controlled by irradiating the sample S with a pulsed beam while controlling the beam blanker 12 in such a way that the duty ratio of the pulsed beam increases (i.e., the dose of the electron beam increases) with increasing absolute value of the tilt angle of the sample S. The relationship between the duty ratio of the pulsed beam (i.e., the ratio of the non-irradiation period to the blanking/unblanking period) and the dose of electron beam is shown in FIG. 2. In particular, let $\theta$ be the tilt angle of the sample S. Let $\theta_{max}$ ($\theta_{max} < 90°$) be the maximum tilt angle. The duty ratio DR of the pulsed beam is set according to $$DR = \cos(|\theta_{max}| - |\theta|) \quad (1)$$

Consequently, the amount of electrons transmitted can be made constant irrespective of the tilt angle $\theta$ of the sample S. In this way, in the technique of the present embodiment, the dose of electron beam is controlled by varying the duty ratio DR of the pulsed beam according to the tilt angle $\theta$ of the sample S and, therefore, the data acquisition time taken to acquire a series of tilted images can be prevented from increasing. This in turn suppresses sample drift and prevents deterioration of the quality of the acquired images. Furthermore, the dose of electron beam on the sample S can be made appropriate for the tilt angle $\theta$ and so irradiation damage to the sample S can be suppressed.

Figure 3:
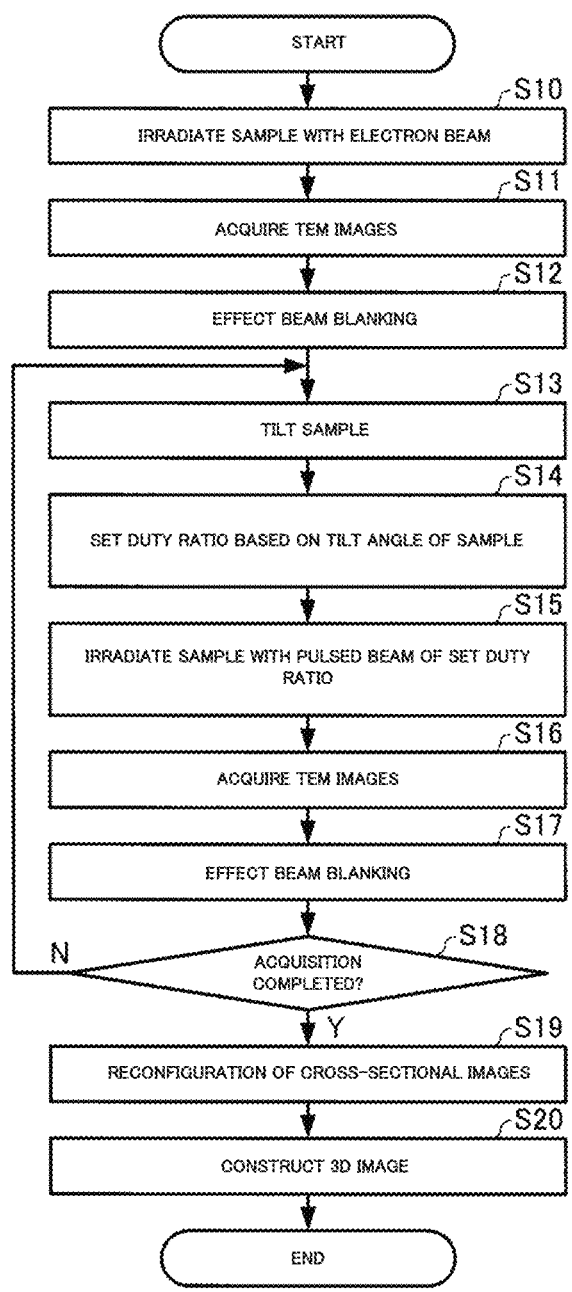
FIG. 3 is a flowchart illustrating a sequence of steps performed by a processor.

One example of the processing sequence of the processor 100 is next described using the flowchart of FIG. 3. First, the blanking controller 102 causes the beam blanker 12 to unblank the electron beam through the blanker controller 20 and emits the electron beam at the sample S (step S10). At this time, the tilt angle θ0 of the sample S is 0°. Then, the image acquisition section 106 acquires a TEM image based on image information from the detector 18 and outputs a signal indicative of completion of image acquisition to the blanking controller 102 (step S11). Upon detection of this signal, the blanking controller 102 causes the beam blanker 12 to blank or cut off the electron beam (i.e., to effect beam blanking) so that the sample S is not irradiated with the electron beam (step S12).

Then, the tilt controller 104 controls the sample stage 15 through the stage controller 21 in accordance with setting information stored in the storage section 130 to tilt the sample S by an intended angle and outputs a signal indicative of completion of tilting to the blanking controller 102 (step S13). Upon detection of this signal, the blanking controller 102 sets the duty ratio DR according to Eq. (1) above based on the present tilt angle θ of the sample S (step S14). The blanking controller 102 controls the beam blanker 12 and irradiates the sample S with a pulsed beam having the set duty ratio DR (step S15). The image acquisition section 106 acquires a TEM image based on the image information from the detector 18 and outputs a signal indicative of completion of image acquisition to the blanking controller 102 (step S16). Upon detection of this signal, the blanking controller 102 causes the beam blanker 12 to blank or cut off the electron beam (i.e., to effect beam blanking) (step S17).

Then, the processor 100 makes a decision as to whether an intended number of tilted TEM images (series of tilted images) have been acquired (step S18). If the decision at step S18 is negative (N), indicating that the acquisition of the series of tilted images is not complete, control goes to step S13. If the decision at step S18 is affirmative (Y), indicating that the acquisition of the series of tilted images is complete, the 3D image generator 108 reconstructs cross-sectional images from the series of tilted images (step S19) and overlaps these reconstructed cross-sectional images to construct a 3D image (step S20).

In step S10, the duty ratio DR may be set using Eq. (1) based on the tilt angle θ (=0°) of the sample S and the sample S may be irradiated with a pulsed beam having the set duty ratio DR in the same way as in steps S14 and S15.

It is to be understood that the present invention is not restricted to the above embodiments and that the invention can be practiced in various modified forms. The present invention embraces configurations substantially identical (e.g., in function, method and results or in purpose and advantageous effects) to the configurations described in the above embodiments. Furthermore, the present invention embraces configurations similar to the configurations described in the above embodiments except that nonessential portions have been replaced. In addition, the present invention embraces configurations identical in advantageous effects or purpose to the configurations described in the above embodiments. Further, the present invention embraces configurations similar to the configurations described in the above embodiments except that a well-known technique is added.

For example, in the description of the above embodiments, the present invention is applied to a transmission electron microscope or a scanning transmission electron microscope. The present invention is not restricted to this example. The charged particle beam system associated with the present invention can be any instrument if it irradiates a tiltably held sample with a charged particle beam. The present invention is also applicable to a scanning electron microscope (SEM) and a focused ion beam (FIB) system.

The invention claimed is:

1. A charged particle beam system comprising:
a beam blanker for blanking a charged particle beam;
a sample stage on which a sample is tiltably held and thus can assume a tilt angle;
a blanking controller for controlling the blanking of the charged particle beam and causing a pulsed beam having a duty ratio to be directed at the sample; and
a tilt controller for controlling the tilt angle of the sample;
wherein the blanking controller sets the duty ratio of the pulsed beam based on the tilt angle of the sample.

2. A charged particle beam system as set forth in claim 1, wherein said blanking controller sets said duty ratio in such a way as to increase with increasing absolute value of said tilt angle.

3. A charged particle beam system as set forth in claim 1, wherein said beam blanker is made of electrostatic deflecting plates.

4. A control method for use in a charged particle beam system comprising a beam blanker for blanking a charged particle beam and a sample stage on which a sample can be tiltably held and thus can assume a tilt angle, said control method comprising:
irradiating the sample with a pulsed beam having a duty ratio while controlling the blanking of the charged particle beam; and
controlling the tilt angle of the sample;
wherein during the step of controlling the blanking, the duty ratio of the pulsed beam is set based on the tilt angle of the sample.

* * * * *